United States Patent [19]

Moye et al.

[11] Patent Number: 5,057,798
[45] Date of Patent: Oct. 15, 1991

[54] SPACE-SAVING TWO-SIDED MICROWAVE CIRCUITRY FOR HYBRID CIRCUITS

[75] Inventors: Christopher A. Moye, Marina Del Rey; Joseph N. Owens, Santa Monica, both of Calif.

[73] Assignee: Hughes Aircraft Company, Los Angeles, Calif.

[21] Appl. No.: 542,239

[22] Filed: Jun. 22, 1990

[51] Int. Cl.⁵ .............................................. H01P 5/00
[52] U.S. Cl. ........................................ 333/33; 333/238
[58] Field of Search ................ 333/33, 238, 246, 247; 455/325, 327

[56] References Cited

U.S. PATENT DOCUMENTS

| | | | |
|---|---|---|---|
| 2,812,501 | 11/1957 | Sommers | 333/238 |
| 3,135,935 | 6/1964 | Engelbrecht | 333/238 |
| 3,303,439 | 2/1967 | Fulp | 333/246 |
| 3,517,272 | 6/1970 | Lee et al. | 333/238 X |
| 3,842,360 | 10/1974 | Dickens | 333/238 X |
| 4,123,730 | 10/1978 | Fikart | 333/246 X |
| 4,494,083 | 1/1985 | Josefsson et al. | 333/238 X |
| 4,675,620 | 6/1987 | Fullerton | 333/238 X |
| 4,816,791 | 3/1989 | Carnahan et al. | 333/33 |

Primary Examiner—Paul Gensler
Attorney, Agent, or Firm—Leonard A. Alkov; Wanda K. Denson-Low

[57] ABSTRACT

A space-saving, two-sided microwave transmission line for hybrid circuits is disclosed, wherein a microstrip or coplanar waveguide RF line is formed on the front side and a microstrip or coplanar waveguid RF transmission line is formed on the backside of a hybrid circuit board containing other components. The RF line is formed on the top side of the circuit board to facilitate connections to other circuit boards and/or RF components, but is routed underneath the board to traverse the areas of the board occupied by other components. When the RF line is on the top side of the substrate, the groundplane is established by the metal layer on the bottom of the substrate for a microstrip line and by a top metal layer for a coplanar waveguide line, and when the RF line is on the bottom of the substrate, the groundplane is established with the metal layer on top of the substrate for a microstrip line, and with the bottom metal layer for a coplanar waveguide line. The connection from the topside and backside RF lines is accomplished by low VSWR plated via holes through the substrate.

25 Claims, 6 Drawing Sheets

SPACE-SAVING TWO-SIDED MICROWAVE CIRCUITRY FOR HYBRID CIRCUITS

BACKGROUND OF THE INVENTION

The present invention relates to microwave transmission lines for transmission of RF signals, and more particularly to a space-saving microstrip or coplanar waveguide transmission line structure particularly useful for hybrid circuits.

Many active RF devices such as active array transmit/receive modules contain DC and control circuitry in close proximity to microstrip or coplanar waveguide RF lines. The RF lines must be separated from all other traces and components to avoid unwanted coupling. The usual technique for accomplishing this is to establish some minimum spacing from the RF line and route the RF line around or through the other lines and components. Sometimes the DC lines are routed underneath the RF line and its groundplane with through-substrate vias and multilayer metallization. These approaches require more circuit board area.

It is therefore an object of this invention to provide a microwave transmission line circuit for use in hybrid circuits which requires less circuit board area, permits close packing of components and leads to smaller and lighter devices.

SUMMARY OF THE INVENTION

An embodiment of a hybrid circuit embodying the invention comprises a microstrip RF line formed on the front and back sides of a ceramic hybrid circuit board containing other components. The RF line is formed on the top side of the circuit board to facilitate connections to other circuit boards and/or RF components, but is routed underneath the board to traverse the areas of the board occupied by other components. When the RF line is on the top side of the substrate, the groundplane is established by the metal layer on the bottom of the substrate; and when the RF line is on the bottom of the substrate, the groundplane is established with the metal layer on top of the substrate. The connection from the topside and backside RF lines is accomplished by low VSWR plated via holes through the substrate.

In most applications, the circuit board must be attached to a housing for mechanical and thermal considerations. In these cases, a channel is machined in the housing to avoid shorting the microstrip line to the housing. The channel width and depth can be made large enough not to affect the microstrip impedance; or if there are size constraints, the channel can be made smaller and help to establish the impedance of the microstrip line.

Using a similar technique, coplanar waveguide may be used instead of microstrip lines on both the topside and backside of the substrate; or on the backside only, with microstrip line on the top surface. In either case, the connections from the topside to the backside RF lines are made with low VSWR plated via holes through the substrate.

BRIEF DESCRIPTION OF THE DRAWINGS

These and other features and advantages of the present invention will become more apparent from the following detailed description of an exemplary embodiment thereof, as illustrated in the accompanying drawings, in which:

FIGS. 13–17 illustrate a transmission line structure employing coplanar waveguide transmission lines in accordance with the invention.

DETAILED DESCRIPTION OF THE PREFERRED EMBODIMENT

Figure 1:
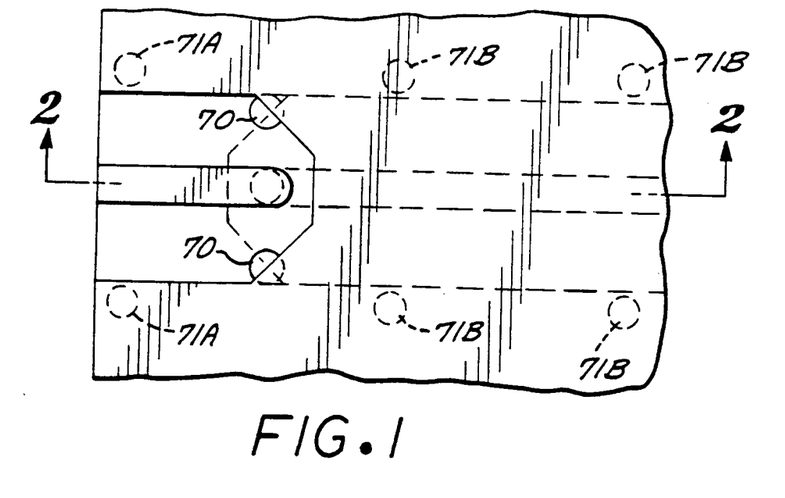
FIG. 1 is a top view of a preferred embodiment of a space-saving, two-sided microstrip transmission line circuit embodying the invention.
Figure 2:
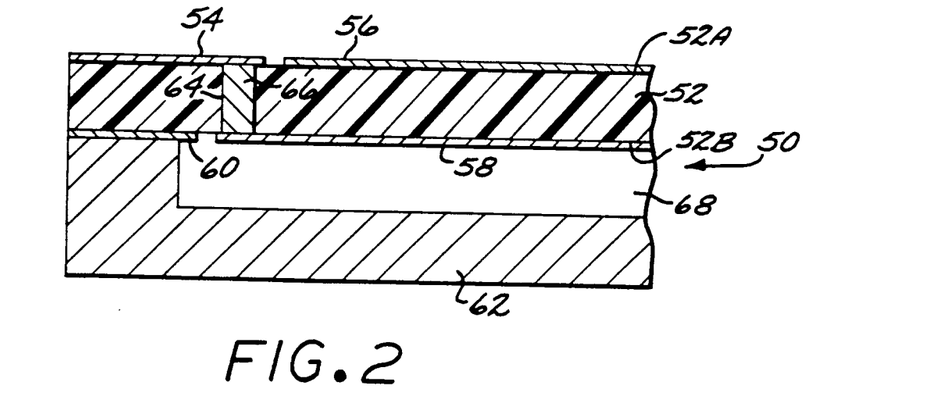
FIG. 2 is a side cross-sectional view of the circuit of FIG. 1 taken along line 2—2.
Figure 3:
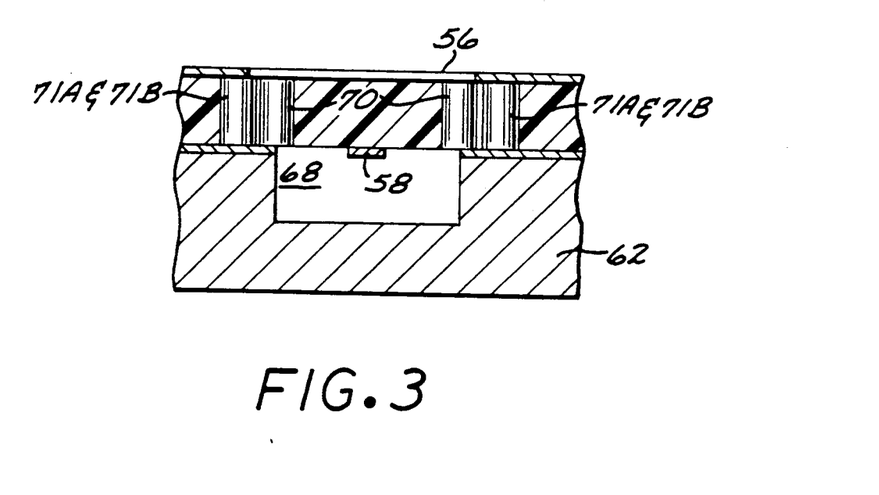
FIG. 3 is a cross-sectional view of the circuit of FIG. 1.
Figure 4:
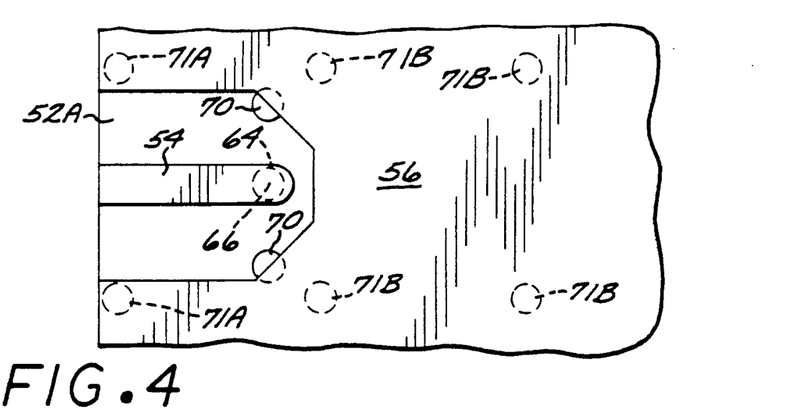
FIG. 4 is a partial top view of the substrate comprising the circuit of FIG. 1.
Figure 5:
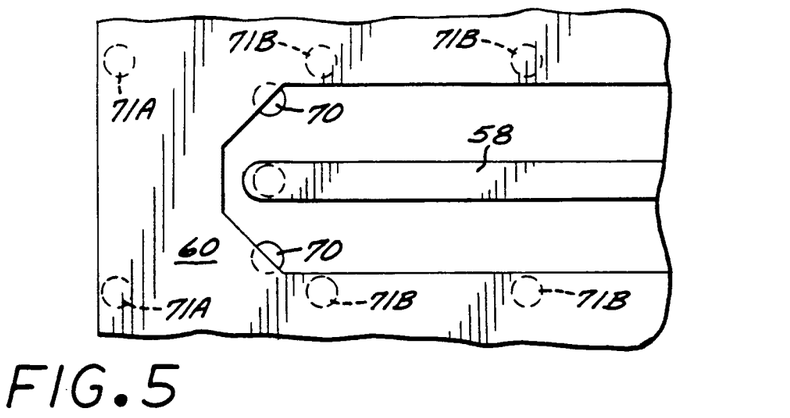
FIG. 5 is a partial bottom view of the substrate comprising the circuit of FIG. 1.

Referring now to FIGS. 1–5, a space-saving, two-sided microstrip circuit 50 embodying the invention is illustrated. The circuit 50 comprises a planar substrate 52, typically formed from a dielectric such as alumina. Conductive metal layer patterns are applied to the upper and lower surfaces 52A and 52B of the substrate 52 in a conventional manner. For example, the circuit may be fabricated from a substrate whose upper and lower surfaces are coated by thin gold layers, and the gold is selectively etched away using photolithographic techniques to form the conductor patterns. As shown more fully in FIGS. 2 and 4, the conductive pattern on the upper surface 52A defines an upper surface microstrip conductor line 54 and a groundplane pattern 56 which serves as the groundplane for the microstrip conductor line formed on the lower surface 52B of the substrate 52. As shown in FIGS. 2 and 5, the conductive pattern on the lower surface 52B is patterned to form a lower microstrip conductor line 58 and a groundplane 60 for the microstrip conductor 54 on the upper surface 52A.

The substrate 52 is supported by a conductive housing 62 which has a channel 68 formed therein adjacent the microstrip line 58 so that the housing 62 does not short the microstrip line 58.

A conductor transition via opening 64 is formed through the substrate 52 between the respective ends of the upper and lower surface microstrip lines 54 and 58. The via opening 64 is plated through or filled with a conductive material 66 such as gold to electrically connect the upper and lower microstrip lines 54 and 58.

The circuit 50 further comprises means for matching the impedance of the via opening 64 to the impedance of the upper and lower microstrip lines. In the design of the two-sided microwave circuitry, there are two obstacles to overcome, in that the via opening presents a VSWR mismatch at the transition between the two microstrip lines, and ground must be efficiently brought up to the top of the substrate for the microstrip line on the substrate bottom.

Figure 6A:
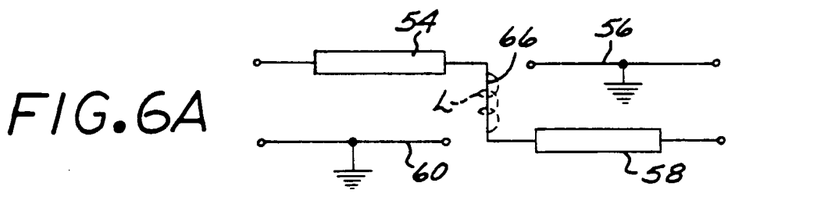
FIGS. 6A–6D are simplified schematic drawings which illustrate the techniques employed to match the impedance of the transition via opening to the microstrip transmission lines of FIG. 1.
Figure 6B:
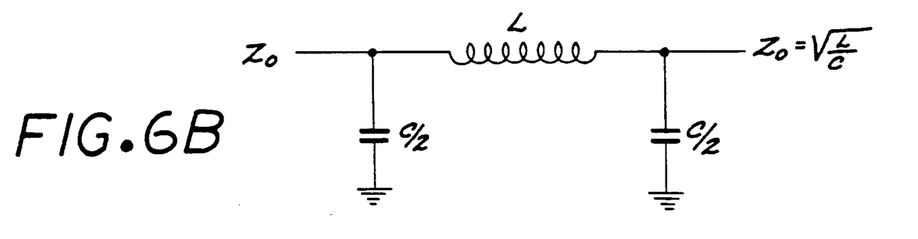

In regard to the first obstacle, the plated via opening acts like a series inductor, L, as illustrated in FIG. 6A, because there is no nearby ground. This series inductance L is not matched to 50 ohms (the characteristic impedance of the two microstrip transmission lines comprising conductor lines 54 and 58) and thus presents an undesirable VSWR. To match the via opening structure to 50 ohms, shunt capacitance C must be added to each end of the inductor L as shown in FIG. 6B to yield a transmission line structure having the desired characteristic impedance. Two grounding mechanisms can be utilized in this transition to add matching shunt capacitance, a) ground from nearby via openings to form a quasi coaxial structure, and b) microstrip line end fringing as final tuning. Through experimentation these grounding mechanisms can be successfully designed to yield broadband low VSWR at the via opening transition.

Figure 6C:
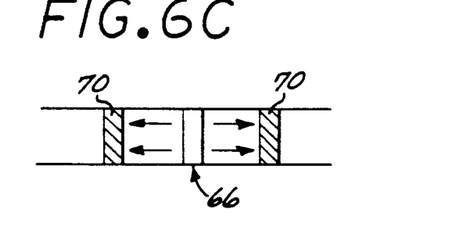
Figure 6D:
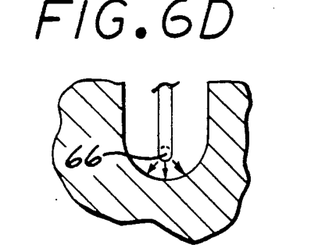
Figure 7:
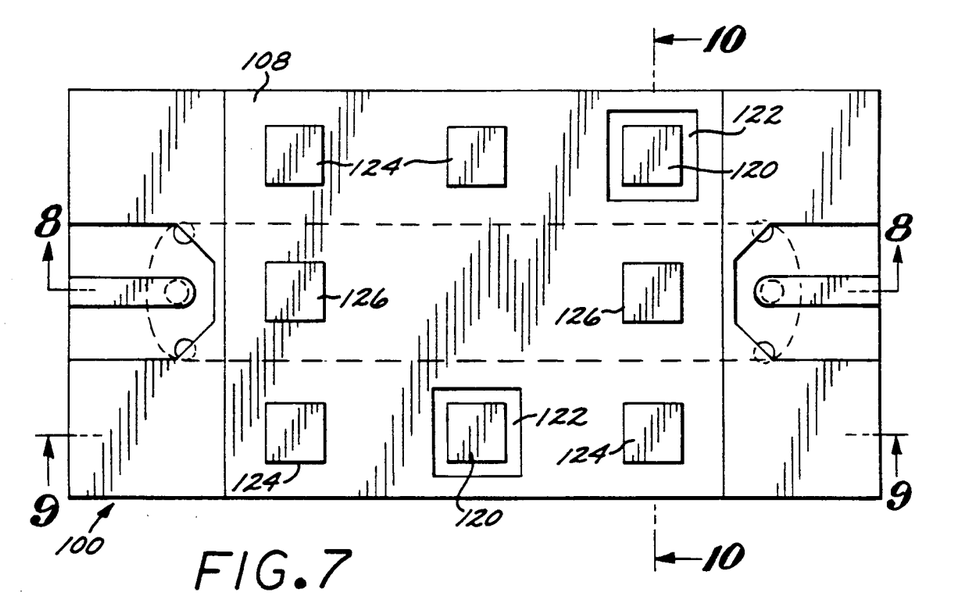
FIG. 7 is a top view of a hybrid circuit employing a space-saving two-sided microstrip line in accordance with the invention.
Figure 8:
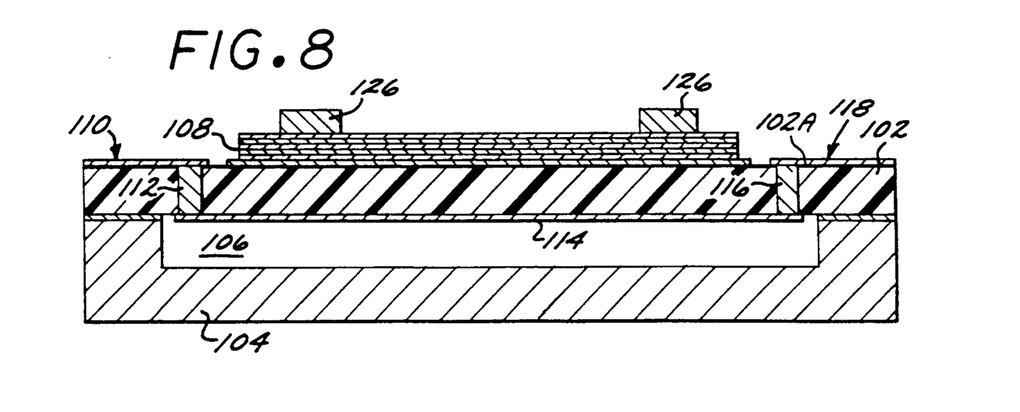
FIG. 8 is a side cross-sectional view of the hybrid circuit of FIG. 7 taken along line 8—8 of FIG. 7.

FIG. 6C illustrates the placement of two grounding via openings 70 adjacent the transition via opening 64 to form a quasi coaxial structure. FIG. 6D illustrates the microstrip line end fringing used to achieve a final tuning of the transition impedance.

The second obstacle of grounding the top groundplane in the region of the microstrip lines can be overcome by placing bottom groundplane to top groundplane connecting via openings 71A and 71B at correct locations and spacing. The location and spacing are important to establish a low inductance ground path from top to bottom and to disable unwanted microwave transmission modes on the top ground surface. Ground must be established on the top surface before the via transition. This is accomplished by the placement of grounding via openings 71A as close as possible to the input microstrip line 54 without affecting its characteristic impedance. The spacing of additional ground via openings 71B from one another along the length of the lower microstrip line 58 to disable unwanted transmission modes on the top ground surface 56 must be much less than one-half wavelength at the highest frequency of interest.

By way of example, the following particular example of a two-sided microstrip circuit on 99.6% alumina achieved low VSWR. Substrate thickness=0.020 inch; microstrip conductor line width=0.019 inch; transition via-hole diameters=0.015 inch; grounding via-holes spaced 0.050 inch from the transition via-hole and having a diameter of 0.010 inch; microstrip line end to groundplane fringing distance of 0.009 inch; and grounding via-hole to grounding via-hole spacing of 0.100 inch.

Referring now to FIGS. 7–10, there is illustrated a hybrid circuit 100 having RF and dc circuits, and employing a two-sided microstrip transmission line in accordance with the invention. The circuit 100 comprises a substrate 102 and housing 104 as described with respect to the embodiment of FIGS. 1-5. A channel 106 is formed in the housing 104. A plurality of dc interconnecting layers indicated generally as element 108 are mounted on the top surface 102A of the substrate 102. The dc interconnecting layers 108, typically formed by a thick-film multilayer process, comprise a layer of electrically non-conductive material and then a layer of circuit traces repeated as many times as necessary to facilitate all required dc circuit connections. Connections are made between layers by means of metal-filled via-holes through the non-conductive material.

Figure 9:
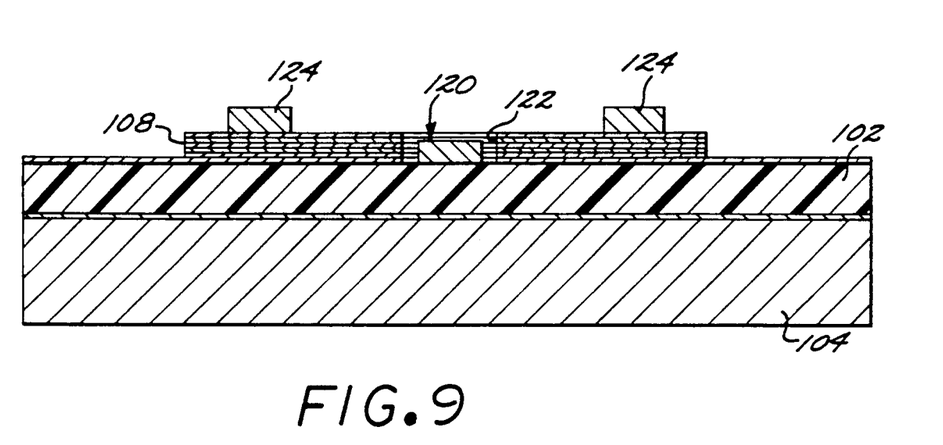
FIG. 9 is a side cross-sectional view of the hybrid circuit of FIG. 7 taken along line 9—9 of FIG. 7.
Figure 10:
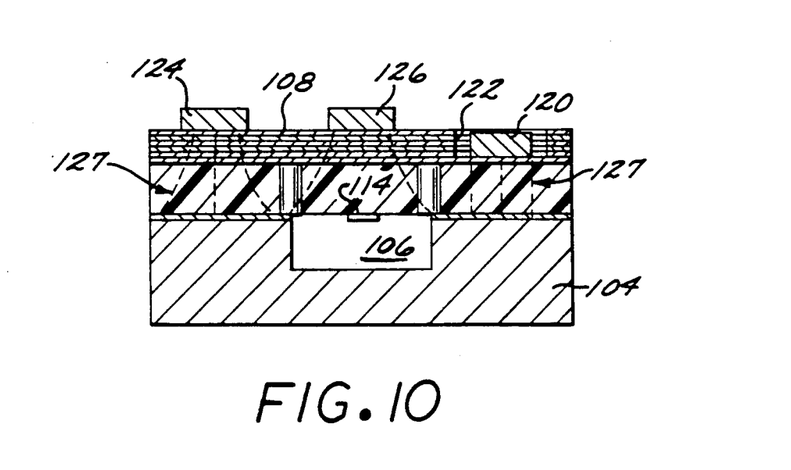
FIG. 10 is a cross-sectional view taken of the hybrid circuit of FIG. 7 along line 10—10 of FIG. 7.

As shown in the cross-sectional views of FIGS. 9 and 10, exemplary dc circuit elements and chips 120, 124 and 126 are distributed over the top surface 102A in a manner which utilizes the heat dissipating properties of the housing for low, medium and high power dissipation chips. Thus, for example, the circuit chips 120 represent high power dissipation circuit elements and are disposed directly on the substrate surface 102A in cutout areas 122 of the layers 108 over a solid housing area, i.e., not directly over the channel 106. The chips 124 represent circuit elements characterized by medium power dissipation and are mounted on top of the layers 108 over a solid housing area. The chips 126 represent circuit elements characterized by low power dissipation and are mounted on the layer 108 over the channel 106 formed in the housing 104. The chips 120, 124 and 126 can be interconnected via the interconnection circuitry 108. As indicated by the heat dissipation lines 127 in the cross-sectional view of FIG. 10, deploying the chips 120, 124 and 126 in the manner shown in FIGS. 7–10 provides improved heat dissipation characteristics for the hybrid circuit 100.

For the circuit 100, the RF transmission line comprises the top surface microstrip conductor 110, which transitions to the lower microstrip conductor line 114 by means of the via opening 112, and which in turn transitions to the upper surface microstrip conductor line 118 by means of via opening 116. The microstrip conductor line therefore is routed from the substrate top surface 102A to the bottom surface 102B to avoid the dc interconnecting circuitry layers 108 and the circuit chips.

Coplanar waveguide may be used instead of microstrip as the microwave transmission line of choice, or it can be combined with microstrip to realize a circuit with both types of microwave transmission lines. Coplanar waveguide is a planar microwave transmission line structure that realizes its characteristic impedance from ground areas spaced at gap G from a center conductor line of width W. The ratio of W/G determines the microwave impedance of the line. A lower groundplane is not required on coplanar waveguide as the ground for the transmission line is on top of the substrate on the same plane as the center conductor line. However, a lower groundplane may be used to help set the characteristic impedance of the line.

Figure 11:
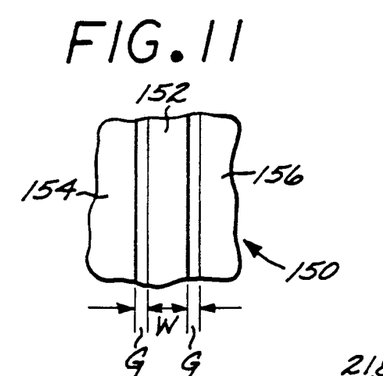
FIG. 11 shows a coplanar waveguide transmission line structure with no lower groundplane.
Figure 12:
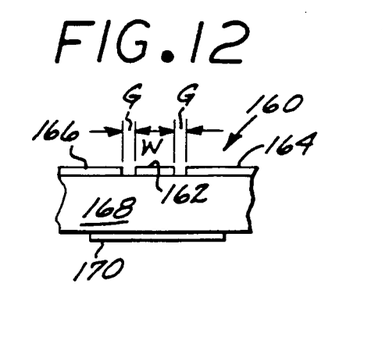
FIG. 12 shows a coplanar waveguide transmission line structure with a lower groundplane.
Figure 13:
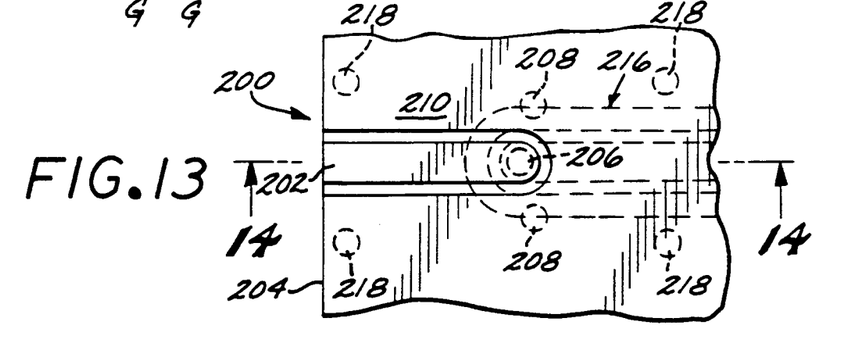
FIG. 13 is a top view showing hidden features in phantom.
Figure 14:
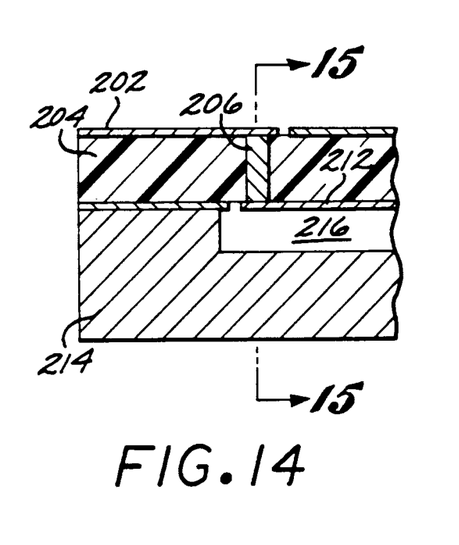
FIG. 14 is a side cross-section view taken along line 14—14 of FIG. 13.
Figure 15:
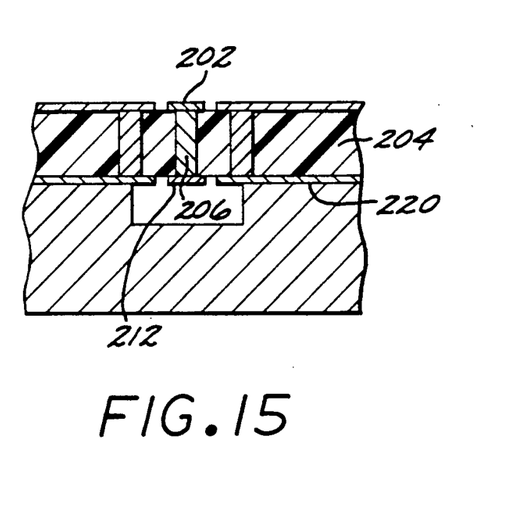
FIG. 15 is an end cross-sectional view taken along line 15—15 of FIG. 14.
Figure 16:
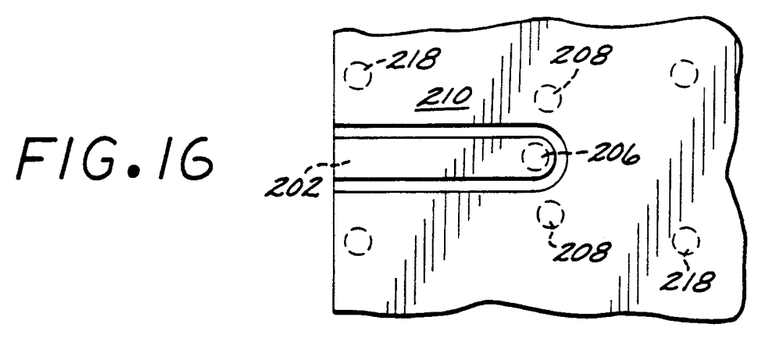
FIGS. 16 and 17 are top and bottom views respectively.
Figure 17:
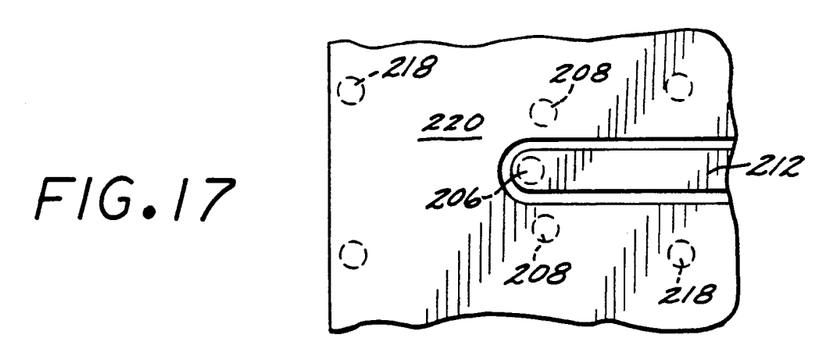

FIG. 11 illustrates a coplanar waveguide transmission line 150, comprising the center conductor line 152 of width W spaced at a gap distance G from the groundplane surfaces 154 and 156. The line 152 and surfaces 154 and 156 can be formed on a dielectric substrate, e.g., aluminum oxide ($Al_2O_3$) FIG. 12 shows a coplanar waveguide transmission line structure employing a groundplane, wherein the center conductor line 162 and coplanar groundplane surfaces 164 and 166 are formed on one surface of the dielectric substrate 168, and the lower groundplane surface 170 is formed on the lower surface of the substrate 168 underlying the line 162 and surfaces 164 and 166.

FIGS. 13-17 illustrate a transmission line structure 200 employing coplanar waveguide transmission lines in accordance with the invention. Here, the center conductor line strip 202 is defined on a top surface of the substrate board 204. Via-hole 206 connects the strip 202 to the corresponding transmission line strip 212 defined on a bottom surface of the substrate board 204. As in the embodiment of FIGS. 1-5, a conductive housing structure 214 defines a channel 216 below the lower surface of the substrate board 204. The via-holes 208 are spaced from the opening 206 to provide impedance matching functions. The additional via-openings 218 electrically connect the upper and lower groundplane surfaces together to disable unwanted transmission modes.

Figure 18:
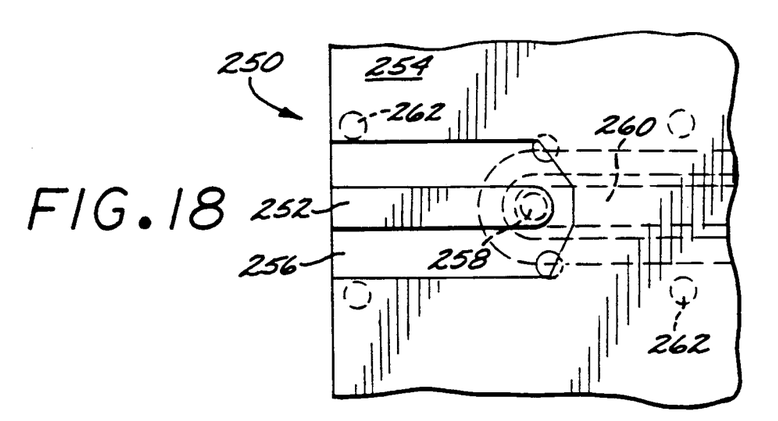
FIG. 18 is a top view illustrating a transmission line structure employing a microstrip transmission line on the top surface, and a coplanar transmission line on the bottom surface, connected by via holes in accordance with the invention.

FIG. 18 illustrates a transmission line structure 250 employing a microstrip transmission line 252 on the top surface of the substrate 256, and a coplanar transmission line 260 on the bottom surface, connected by a via-hole 258 in accordance with the present invention. The advantage of using coplanar waveguide on the backside is that narrow lines can be used since the transmission line impedance is affected by the coplanar waveguide width and spacing and not by the substrate thickness, as is the case for microstrip. The RF loss of the coplanar waveguide is higher than that of microstrip, however, especially when the width and spacing are made small.

It is understood that the above-described embodiments are merely illustrative of the possible specific embodiments which may represent principles of the present invention. Other arrangements may readily be devised in accordance with these principles by those skilled in the art without departing from the scope of the invention.

We claim:

1. A space-saving two-sided microwave transmission line for a hybrid circuit having RF circuits and dc circuits mounted on a common substrate, comprising:
   a substrate comprising an insulating layer having first and second substantially planar surfaces;
   a first coplanar waveguide having a first characteristic impedance and comprising a first transmission line conductor formed on said first surface of said substrate and further characterized by corresponding first planar conductive areas formed on said first surface and spaced from said first line conductor;
   a second coplanar waveguide having a second characteristic impedance equal to said first characteristic impedance and comprising a second transmission line conductor formed on said second surface of said substrate and further characterized by corresponding second planar conductive areas formed on said second surface and spaced from said second line conductor;
   a line-connecting via opening formed through said substrate and comprising means for electrically connecting said first transmission line conductor to said second transmission line conductor through said via opening; and
   matching means for substantially matching the via opening impedance to said characteristic impedances of said first and second coplanar waveguides.

2. The transmission line of claim 1 wherein said matching means comprises a plurality of spaced ground via openings through said substrate to interconnect corresponding first and second groundplanes formed on said first and second surfaces of said substrate to provide shunt capacitance to said line-connecting via opening.

3. The transmission line of claim 1, further comprising a housing structure for supporting portions of the second surface of the substrate, the housing structure having a recessed region formed therein adjacent the second microwave conductor line.

4. The transmission line of claim 2 further comprising means for establishing a low inductance ground path between the respective groundplanes, said means comprising a plurality of groundplane connecting vias through via openings in said substrate.

5. A hybrid circuit having RF circuits and dc circuits, mounted on a common substrate, comprising:
   a substrate comprising an insulating layer having first and second substantially planar surfaces;
   a circuit housing structure for supporting edges of the second surface of said substrate;
   said dc circuits being mounted on a first region of said substrate first surface;
   a first microwave conductor line formed on said first surface of said substrate and terminating at a first conductor line end adjacent one side of said first region;
   a second microwave conductor line formed on said second surface of said substrate beneath said first region and terminating in a second conductor line end at said one side of said first region;
   a via opening formed through said substrate to connect said first line end to said second line end; and
   impedance matching means for matching the via opening impedance to the characteristic impedance of said first and second microwave transmission lines.

6. The hybrid circuit of claim 5 wherein said matching means comprises a plurality of spaced ground via openings through said substrate to interconnect corresponding first and second groundplanes formed on corresponding areas of said first and second surfaces to provide shunt capacitance to said transmission line interconnecting via opening.

7. The hybrid circuit of claim 5 wherein said housing structure has a recessed region formed therein adjacent the second microwave conductor line.

8. The hybrid circuit of claim 5 wherein said dc circuits comprise one or more discrete circuit devices and one or more layers of interconnecting circuitry for interconnecting said discrete circuit devices and located within said first region of said substrate first surface.

9. The hybrid circuit of claim 8 wherein said discrete circuit devices are arranged to provide heat dissipation from said circuit devices to said housing, wherein circuit devices characterized by high heat generation are disposed on said substrate first surface directly over a region of the housing which is in contact with the second surface of the substrate.

10. The hybrid circuit of claim 5 further comprising means for establishing a low inductance ground path from corresponding groundplanes defined on said first and second surfaces, said means comprising a plurality of groundplane connecting vias through via openings in said substrate.

11. The transmission line of claim 5 wherein said first microwave transmission line conductor comprises a first microstrip transmission line further characterized by a corresponding first groundplane formed on corresponding areas of the second surface of said substrate.

12. The transmission line of claim 11 wherein said second microwave transmission line conductor comprises a second microstrip transmission line further characterized by a corresponding second groundplane formed on corresponding areas of said first surface of said substrate.

13. The transmission line of claim 5 wherein said second microwave transmission line conductor comprises a coplanar waveguide conductor transmission line further characterized by a corresponding regions of second surface spaced from said coplanar waveguide conductor transmission line.

14. A space-saving two-sided microstrip transmission line for a hybrid circuit comprising RF circuits mounted on a common substrate, comprising:
   a substrate comprising an insulating layer having a first and second substantially planar surfaces;
   a first microstrip conductor formed on said first surface of said substrate with a corresponding first groundplane formed on corresponding areas of said second surface of said substrate, said first conductor and ground plane comprising a first microstrip transmission line characterized by a first characteristic impedance;
   a second microstrip conductor formed on said second surface of said substrate with a corresponding second ground plane formed on corresponding area of said first surface of said substrate, said second conductor and groundplane comprising a second microstrip transmission line characterized by a second characteristic impedance equal to said first characteristic impedance;
   a via opening formed through said substrate to connect said first microstrip transmission line to said second microstrip transmission line; and
   matching means for matching the via opening impedance to said characteristic impedances of said first and second microstrip transmission lines.

15. The microstrip transmission line of claim 14 wherein said matching means comprises a plurality of spaced ground via openings through said substrate to interconnect said first and second groundplanes to provide shunt capacitance to said transmission line interconnecting via opening.

16. The microstrip transmission line of claim 14 wherein said matching means comprises fringing capacitance between the end of said first microstrip conductor and surrounding portions of said first groundplane.

17. The microstrip transmission line of claim 14 further comprising a housing structure for supporting portions of the second surface of the substrate, the housing structure having a recessed region formed therein adjacent the second microstrip conductor line.

18. The microstrip transmission line of claim 14 further comprising means for establishing a low inductance ground path from the first groundplane to the second groundplane, said means comprising a plurality of groundplane connecting vias through via openings in said substrate.

19. A hybrid circuit having RF circuits and dc circuits, mounted on a common substrate, comprising:
   a substrate comprising an insulating layer having first and second substantially planar surfaces;
   a circuit housing structure for supporting edges of the second surface of said substrate;
   said dc circuits being mounted on a first region of said substrate first surface;
   a first microstrip conductor line formed on said first surface of said substrate and terminating at a first conductor line end adjacent one side of said first region;
   a second microstrip conductor line formed on said second surface of said substrate beneath said first region and terminating in a second conductor line end at said one side of said first region;
   a second groundplane formed on said first surface of said substrate within said first region;
   a via opening formed through said substrate to connect said first line end to said second line end; and
   impedance matching means for matching the via opening impedance to the characteristic impedance of said first and second microwave transmission lines.

20. The hybrid circuit of claim 19 wherein said matching means comprises a plurality of spaced ground via openings through said substrate to interconnect said first and second ground planes to provide shunt capacitance to said transmission line interconnecting via opening.

21. The hybrid circuit of claim 19 wherein said matching means comprises fringing capacitance between the end of said first microstrip conductor and surrounding portions of said first groundplane.

22. The hybrid circuit of claim 19 wherein said housing structure has a recessed region formed therein adjacent the second microstrip conductor line.

23. The hybrid circuit of claim 19 wherein said dc circuits comprise one or more discrete circuit devices and one or more layers of interconnecting circuitry for interconnecting said discrete circuit devices and located within said first region of said substrate first surface.

24. The hybrid circuit of claim 23 wherein said discrete circuit devices are arranged to provide heat dissipation from said circuit devices to said housing, wherein circuit devices characterized by high heat generation are disposed on said substrate first surface directly over a region of the housing which is in contact with the second surface of the substrate.

25. The microstrip transmission line of claim 19 further comprising means for establishing a low inductance ground path from the first groundplane to the second groundplane, said means comprising a plurality of groundplane connecting vias through via openings in said substrate.

* * * * *

UNITED STATES PATENT AND TRADEMARK OFFICE
CERTIFICATE OF CORRECTION

PATENT NO.   : 5,057,798
DATED        : October 15, 1991
INVENTOR(S)  : Moye et al.

It is certified that error appears in the above-indentified patent and that said Letters Patent is hereby corrected as shown below:

Column 1, after the title and before the heading "BACKGROUND OF THE INVENTION," insert the paragraph:  --This invention was made with Government support under Contract No. G6228-FCOK awarded by the Government.  The Government has certain rights in this invention.--

Signed and Sealed this

Twenty-first Day of February, 1995

Attest:

BRUCE LEHMAN

Attesting Officer

*Commissioner of Patents and Trademarks*